US008392807B2

(12) United States Patent
Naradasi et al.

(10) Patent No.: US 8,392,807 B2
(45) Date of Patent: Mar. 5, 2013

(54) SYSTEM AND METHOD OF DISTRIBUTIVE ECC PROCESSING

(75) Inventors: Jayaprakash Naradasi, Bangalore (IN); Anand Venkitachalam, Bangalore (IN)

(73) Assignee: Sandisk Technologies Inc., Plano, TX (US)

( * ) Notice: Subject to any disclaimer, the term of this patent is extended or adjusted under 35 U.S.C. 154(b) by 281 days.

(21) Appl. No.: 12/882,357

(22) Filed: Sep. 15, 2010

(65) Prior Publication Data
US 2012/0023384 A1  Jan. 26, 2012

(30) Foreign Application Priority Data

Jul. 23, 2010  (IN) .......................... 2093/MUM/2010

(51) Int. Cl.
*H03M 13/00* (2006.01)
(52) U.S. Cl. .......................... 714/784; 714/758; 714/785
(58) Field of Classification Search .................. 714/758, 714/784, 785
See application file for complete search history.

(56) References Cited

U.S. PATENT DOCUMENTS

| 6,052,815 | A  | * | 4/2000 | Zook | ............................ | 714/758 |
| 6,192,497 | B1 |   | 2/2001 | Yang et al. | | |
| 6,473,880 | B1 | * | 10/2002 | Cypher | .......................... | 714/800 |
| 6,480,416 | B2 | * | 11/2002 | Katayama et al. | ........ | 365/185.09 |
| 6,956,577 | B2 | * | 10/2005 | Radke et al. | ................... | 345/531 |
| 7,089,276 | B2 | * | 8/2006 | Miller et al. | .................. | 708/492 |
| 7,350,133 | B2 |   | 3/2008 | Kim et al. | | |
| 7,509,564 | B2 | * | 3/2009 | Dohmen et al. | .............. | 714/782 |
| 7,539,927 | B2 | * | 5/2009 | Lee et al. | ....................... | 714/784 |
| 2009/0222708 | A1 | | 9/2009 | Yamaga | | |
| 2010/0011247 | A1 | | 1/2010 | Shrader et al. | | |

FOREIGN PATENT DOCUMENTS

| EP | 0218413 A2 | 4/1987 |
| EP | 0373764 A2 | 6/1990 |
| EP | 0989492 A2 | 3/2000 |
| JP | 2005-293779 A | 10/2005 |

OTHER PUBLICATIONS

The International Search Report and Written Opinion mailed Apr. 27, 2012, issued in International Application No. PCT/US2011/051231, 8 pages.

* cited by examiner

*Primary Examiner* — Esaw Abraham
(74) *Attorney, Agent, or Firm* — Toler Law Group, PC

(57) ABSTRACT

Systems and methods to perform distributive ECC operations are disclosed. A method includes, in a controller of a memory device, receiving data including a data block and main error correction coding (ECC) data for the data block. The data block includes a first sub-block of data and first ECC data corresponding to the first sub-block. The method includes initiating a data block ECC operation to process the data block using the main ECC data and initiating a sub-block ECC operation to process the first sub-block using the first ECC data. The method also includes selectively initiating an error location search of the data block ECC operation based on a result of the sub-block ECC operation.

23 Claims, 6 Drawing Sheets

SYSTEM AND METHOD OF DISTRIBUTIVE ECC PROCESSING

FIELD OF THE DISCLOSURE

The present disclosure is generally related to error correction coding (ECC) processing.

BACKGROUND

During the process of writing data into memory, the data is often encoded with extra bits ("parity bits") to form a codeword. In the presence of noise, some of the bits representing the codeword may change, corrupting the original codeword with errors. When the codeword is read from the memory, a decoder may be used to identify and correct the errors using error correction coding (ECC). For example, Bose-Chaudhuri-Hocquenghem (BCH) ECC schemes are used in applications where bit errors tend to be uncorrelated. An error correction capability of an ECC scheme tends to increase as the length of the codewords increases. As a result, ECC schemes implemented in data storage systems and communication devices tend to use longer codewords.

BCH decoding can be performed in multiple sequential stages to correct errors in received data. For example, a BCH decoder can generate syndrome components for a received codeword that may include errors. The BCH decoder can generate a key equation (e.g. an error location polynomial) may be generated based on the computed syndromes and may indicate a number of errors detected in the received codeword. Locations of the detected errors within the received codeword may be determined based on roots of the key equation via an iterative process such as a Chien search. Since the Chien search process is typically preformed sequentially on each value in the received codeword, an amount of time to process the codeword may be proportional to the codeword length. As codeword lengths increase, delays caused by Chien search processing can impose limits on the speed of ECC data correction.

SUMMARY

Distributive ECC processing includes concurrent processing of a data block and one or more sub-blocks of the data block. When a sub-block is determined to have no errors or to have errors that are correctable during sub-block processing, one or more portions of the data block processing may be skipped. For example, a Chien search performed during the data block processing may skip sub-blocks that have been corrected during sub-block processing. As a result, average time to process ECC codewords may be reduced as compared to performing a full Chien search of every received codeword.

DETAILED DESCRIPTION

Systems and methods are disclosed that use linear error location searches such as Chien searches during ECC decoding and that have reduced latency even when errors occur at the end of a block of data. An approximate location of one or more errors can be determined and the error location search can be started from the determined location. An approximate error location may be determined by dividing the data block into sub-blocks and performing distributive ECC processing on the individual sub-blocks. Errors in the sub-blocks can be found using a smaller ECC than used for the main block. Sub-blocks having few errors can be corrected during sub-block processing, reducing a number of cycles to perform of the main block error location search and thus reducing latency.

Figure 1:
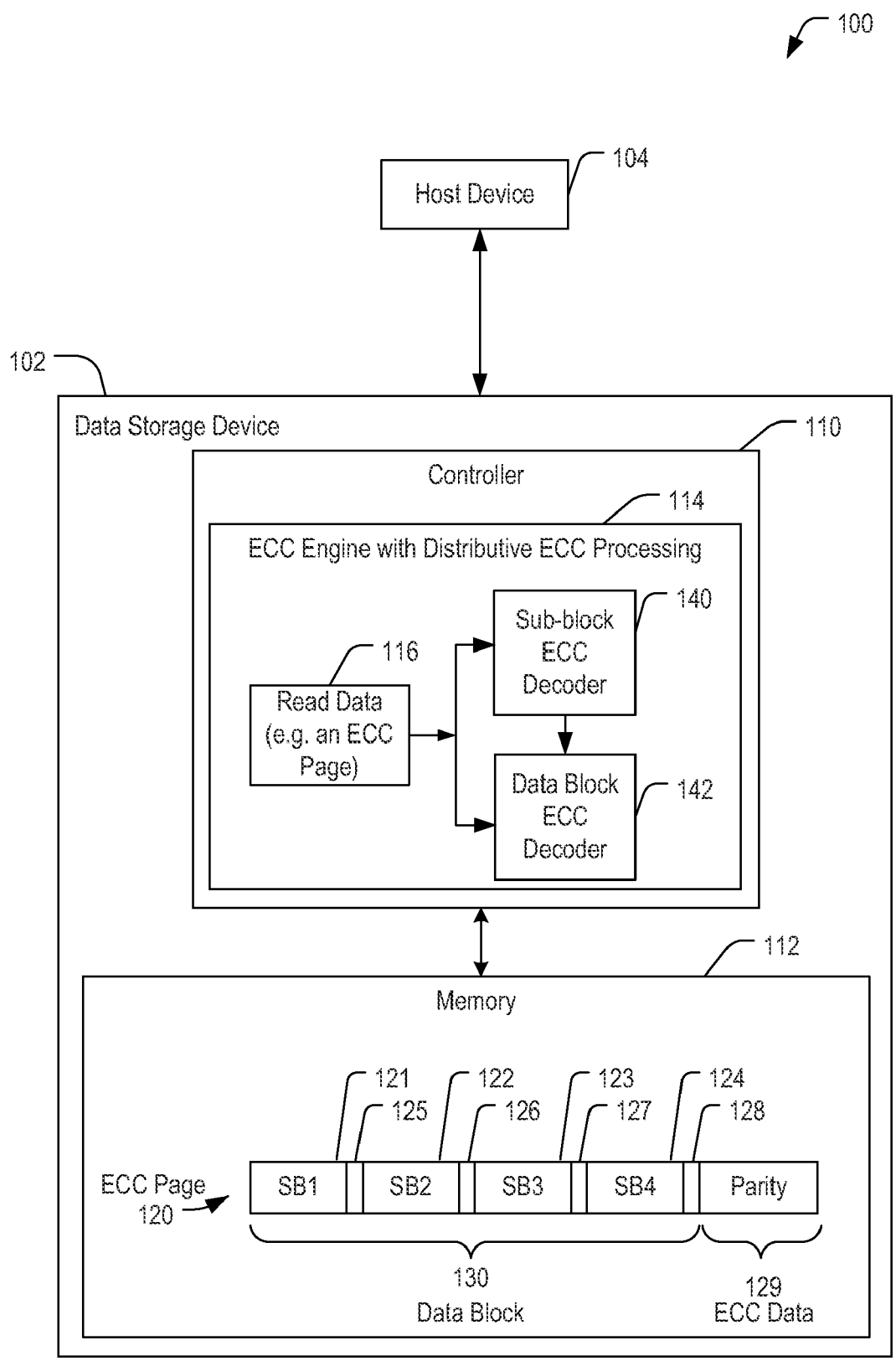
FIG. 1 is a block diagram of a particular illustrative embodiment of a system that includes a data storage device having an error correction coding (ECC) engine with distributive ECC processing.

Referring to FIG. 1, a particular embodiment of a system to perform distributive error correction coding (ECC) processing is depicted and generally designated 100. The system 100 includes a data storage device 102 with an ECC engine 114 that is configured to perform distributive ECC processing. The system 100 also includes a host device 104 that is operatively coupled to the data storage device 102.

In a particular embodiment, the host device 104 is configured to communicate with the data storage device 102 and to send requests for data stored at the data storage device 102. The host device 104 is further configured to receive data provided by the data storage device 102 in response to the requests. For example, the host device 104 may include a mobile telephone, a music or video player, a gaming console, an electronic book reader, a personal digital assistant (PDA), a computer such as a laptop computer or notebook computer, any other electronic device, or any combination thereof.

The data storage device 102 includes a controller 110 and a memory 112. The controller 110 is configured to manage the memory 112 and to enable communications with the host device 104 when the data storage device 102 is operatively coupled to the host device 104. The controller 110 includes the ECC engine 114 and may be configured to receive data read from the memory 112 and to provide the received data to the ECC engine 114. The controller 110 may be configured to retrieve data output by the ECC engine 114, such as decoded data that has been corrected for one or more errors that occurred during storage or transmission, and to provide the decoded corrected data to the host device 104.

The memory 112 is configured to store information, such as data (e.g. user data) and ECC data (e.g. redundant data or "parity") associated with the data. For example, the data may include data of a multimedia file to be stored at the memory 112, and the parity may include redundant information to enable the ECC engine 114 to detect and correct errors in the data. The data and corresponding ECC data may be stored together as a data word. The memory 112 may be a non-volatile memory. For example, the memory 112 may be a flash memory, such as a NAND flash memory. To illustrate, the data storage device 102 may be a memory card, such as a Secure Digital SD® card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). As another example, the data storage device 102 may be configured to be coupled to the host device 104 as embedded memory, such as eMMC® (trademark of JEDEC Solid State Technology Association, Arlington, Va.) and eSD, as illustrative examples.

A representative ECC page 120 is stored in the memory 112. The ECC page 120 includes a data block 130 that includes a first sub-block (SB1) 121, a second sub-block (SB2) 122, a third sub-block (SB3) 123, and a fourth sub-block (SB4) 124. The data block 130 further includes ECC data associated with each of the sub-blocks 121-124, such as first sub-ECC data 125, second sub-ECC data 126, third sub-ECC data 127, and fourth sub-ECC data 128. In addition to the data block 130 with the combined sub-blocks 121-124 and the combined sub-ECC blocks 125-128, the ECC page 120 also includes a parity block 129 that stores ECC data corresponding to the data block 130.

The ECC engine 114 is configured to perform an ECC decoding operation on received data via distributive ECC processing. For example, the ECC engine 114 may perform decoding according to a BCH scheme, a Reed-Solomon scheme, or any other scheme that searches for error locations serially, such as by using a Chien search. The ECC engine 114 may receive data read from memory, such as the ECC page 120, and process the read data 116 along parallel processing paths. A first processing path includes a data block ECC decoder 142 to perform a decode of an entire ECC codeword, such as the entire ECC page 120 including the data block 130 and the ECC data 129. A second parallel processing path includes a sub-block ECC encoder 140 to perform ECC processing of one or more sub-blocks (e.g. the sub-blocks 121-124) of the data using ECC data corresponding to the sub-blocks (e.g. sub-ECC data 125-128). The ECC engine 114 may initiate a data block ECC operation at the data block ECC decoder 142 and a sub-block ECC operation at the sub-block ECC encoder 140 substantially concurrently.

During operation, in response to detected errors in one or more of the sub-blocks 121-124 that are correctable at the sub-block ECC decoder 140 using the sub-ECC data 125-128, an amount of ECC processing for the data block 130 at the data block ECC decoder 142 may be reduced. For example, three of the four sub-blocks (e.g. sub-blocks 121-123) may be determined to be correctable via the sub-block ECC processing at the sub-block ECC decoder 140. As a result, an error location search at the data block ECC decoder 142 may be selectively initiated to bypass the correctable sub-blocks 121-123 and may be constrained to locating errors in the sub-block 124 that were determined to be uncorrectable by the sub-block ECC processing. Examples of sub-block and data block processing are described in further detail with respect to FIGS. 3-4.

Each sub-block 121-124 may be processed more quickly than the ECC page 120 but may have a reduced error correction rate (and possibly a greater chance of mis-correction) due to a smaller number of ECC bits in the sub-ECC data 125-128. By using distributive ECC processing, the ECC engine 114 provides ECC decoding that has the strength associated with an overall parity for an ECC page while enabling faster operation when one or more sub-blocks can be corrected in parallel with correcting the ECC page.

Figure 2:
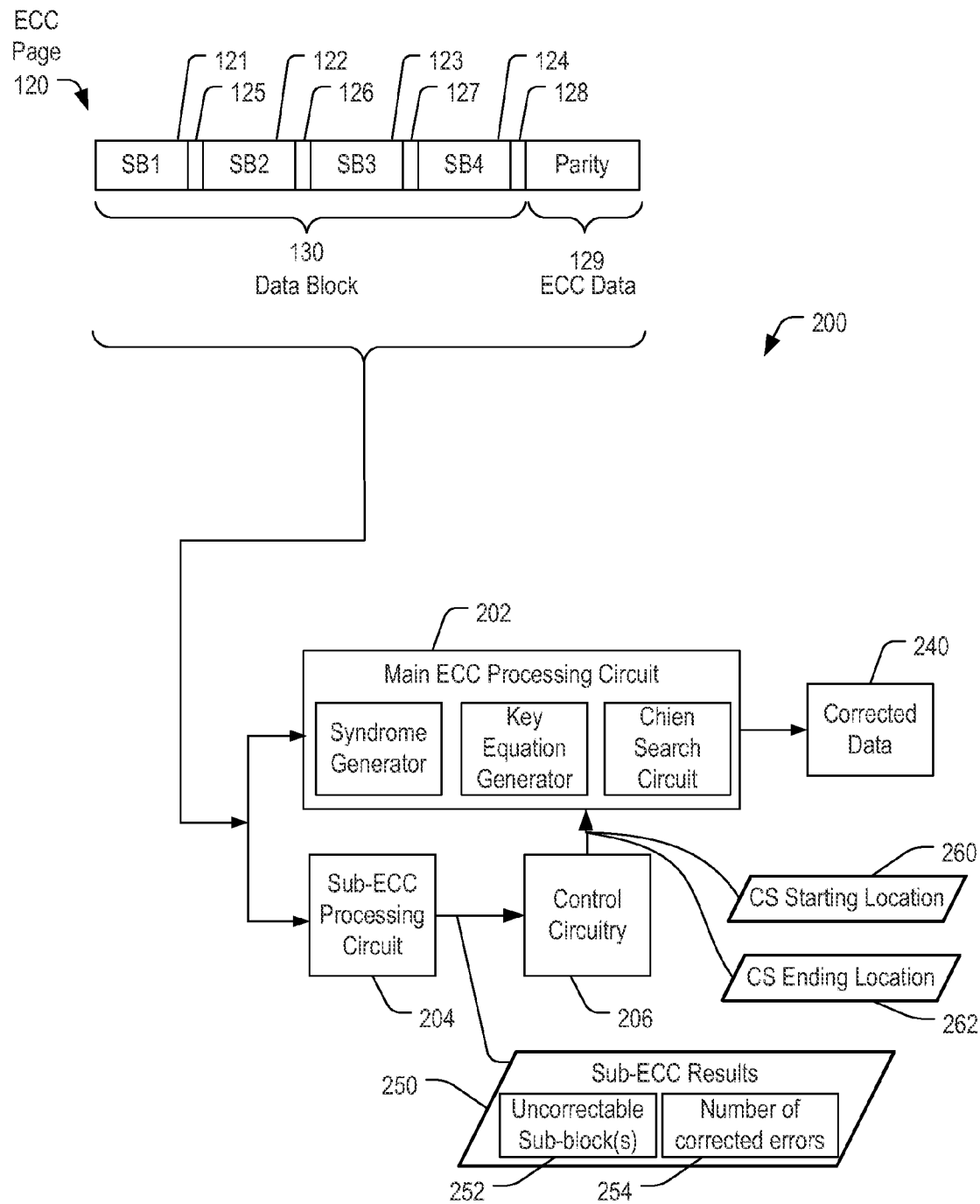
FIG. 2 is a block diagram of a particular illustrative embodiment of a system to perform distributive ECC processing.

Referring to FIG. 2, a particular embodiment of a system to perform distributive ECC processing is depicted and generally designated 200. The system 200 includes a main ECC processing circuit 202 and a sub-ECC processing circuit 204. For example, the main ECC processing circuit 202 may correspond to the data block ECC decoder 142 of FIG. 1 and the sub-ECC processing circuit 204 may correspond to the sub-block ECC decoder 140 of FIG. 1. An output of the sub-ECC processing circuit 204 is provided to control circuitry 206. The control circuitry 206 has an output coupled to the main ECC processing circuitry 202. The system 200 is configured to receive a data word, illustrated as the ECC page 120.

The ECC page 120 is provided via parallel processing paths for processing at the main ECC processing circuit 202 and at the sub-ECC processing circuit 204. The main ECC processing circuit 202 may perform ECC processing on the entire ECC page 120. For example, the main ECC processing circuit 202 may generate syndromes, determine a key equation having an order that indicates a number of errors in the ECC page 120, and locate errors, such as by performing a Chien search. The resulting data after correction of the errors is provided as corrected data 240.

The sub-ECC processing circuit 204 may be configured to perform ECC processing of the first sub-block 121 using the first sub-ECC data 125. The sub-ECC processing circuit 204 may determine syndromes, generate a key equation, and perform a Chien search of the first sub-block 121 using the first sub-ECC data 125. The sub-ECC processing circuit 204 may be configured to also process the second sub-block 122 using the second sub-ECC data 126, the third sub-block 123 using the third sub-ECC data 127, and the fourth sub-block 124 using the fourth sub-ECC data 128. For example, the sub-ECC processing circuit 204 may be configured to process one or more stages of the ECC processing in a pipelined manner as described with respect to FIG. 3. As another example, the sub-ECC processing circuit 204 may include multiple parallel ECC processing circuits to process two or more of the sub-blocks 121-124 in parallel with each other.

Results 250 of the sub-ECC processing are provided to the control circuitry 206. Such results may include a number of errors 254 detected during sub-ECC processing of each of the sub-blocks 121-124, one or more indications 252 that indicate whether any of the sub-blocks 121-124 were uncorrectable (i.e., having more errors than are correctable using the sub-ECC data 125-128), other information, or any combination thereof. The control circuitry 206 may be configured to determine one or more parameters, such as a Chien search starting location 260 and a Chien search ending location 262, to more efficiently continue processing of the main ECC processing circuit 202 based on the results returned from sub-ECC processing circuit 204.

For example, various components of ECC processing may require differing amounts time. To illustrate, syndrome calculations may be performed in a fixed time interval, while generation of a key equation may require an amount of time that is proportional to the number of errors in the ECC page, and performing the Chien search may also require an amount of time that is proportional to the number of errors and position of the errors in the ECC page. Results of the sub-ECC processing circuit 204 indicating whether or not errors have been corrected or whether errors were uncorrectable in each of the sub-blocks 121-124 may enable the main ECC processing circuit 202 to bypass performance of one or more aspects of the main ECC processing. To illustrate, when the sub-ECC processing circuit 204 is capable of correcting all detected errors in the first three sub-blocks 121-123, but is unable to correct errors occurring in the fourth sub-block 124, the control circuitry 206 may be configured to instruct the main ECC processing circuit 202 to selectively initiate Chien search processing at the beginning of the fourth sub-block 124 (i.e., at the first bit following the third ECC data 127). In this manner, a total number of Chien search processing cycles at the main ECC processing circuit 202 may be substantially reduced due to the parallel ECC processing of the first three sub-blocks 121-123.

Figure 3:
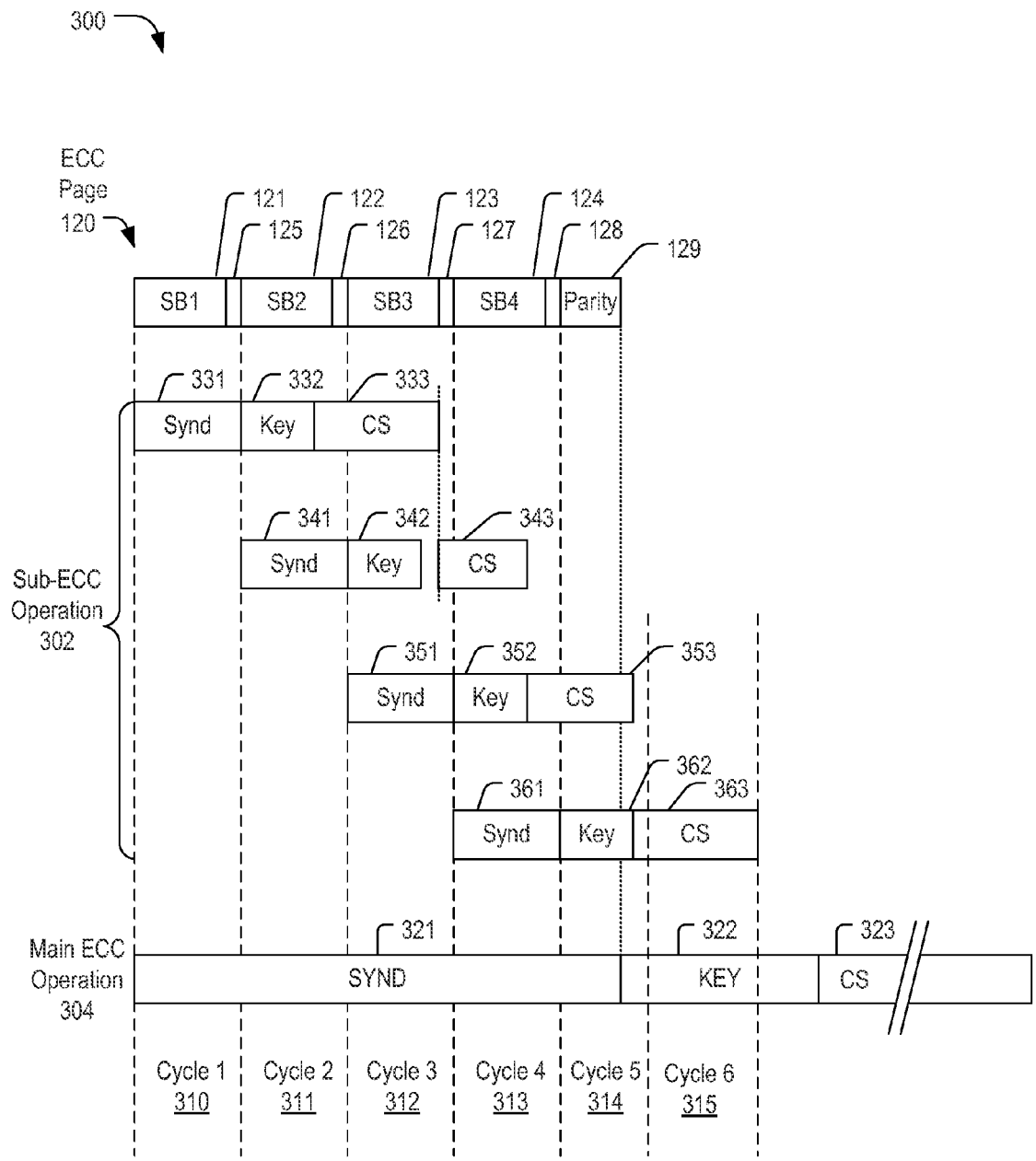
FIG. 3 is a data flow diagram of a particular illustrative embodiment of pipelined distributive ECC processing.

Referring to FIG. 3, a data flow diagram illustrating an example of ECC processing in a distributive ECC system, such as the ECC engine 114 of FIG. 1 or the system 200 of FIG. 2, is illustrated and generally designated 300. Data flow is depicted according to a representative timing of ECC processing with reference to the ECC page 120 of FIG. 1 and includes data flow in a sub-ECC operation 302 and data flow in a main ECC operation 304. The sub-ECC operation 302 may correspond to processing in the sub-block ECC decoder 140 of FIG. 1 or in the sub-ECC processing circuit 204 of FIG. 2. The main ECC operation 304 may correspond to processing in the data block ECC decoder 142 of FIG. 1 or in the main ECC processing circuit 202 of FIG. 2.

As illustrated, the sub-ECC operation 302 may be pipelined across multiple pipeline cycles, such as a first cycle 310, a second cycle 311, a third cycle 312, a fourth cycle 313, a fifth cycle 314, and a sixth cycle 315. Each of the cycles 310-315 is illustrated as generally corresponding to a respective portion of the ECC page 120 and also corresponding to a processing time of each pipeline stage associated with the sub-ECC processing.

The sub-ECC operation 302 may include a first pipeline stage to compute syndromes for a received sub-block, a second pipeline stage to generate a key equation for each sub-block based on the computed syndromes, and a third pipeline stage to perform a Chien search to locate and correct errors in the sub-block. The pipeline stages can be arranged so that a sequentially next sub-block enters the first pipeline stage each cycle and three or more sub-blocks can be concurrently processed, with one sub-block at each pipeline stage and with processing of each sub-block at least partially overlapping processing of one or more other sub-blocks.

To illustrate, the first cycle 310 includes processing of the first sub-block 121 using the first ECC data 125, illustrated as first syndrome processing 331 during which syndrome calculation for the first sub-block 121 is performed using the first sub-ECC data 125. Also, syndrome generation 321 for the main ECC operation 304 begins during the first cycle 310.

The second cycle 311 follows the first cycle 310 and includes processing of the second sub-block 122 using the second ECC data 126 entering the pipeline, beginning with second syndrome processing 341. In addition, during the second cycle 311, first key equation generation 332 for the first sub-block 121 is performed. Following the first key equation generation 332 for the first sub-block 121, first Chien search processing 333 for the first sub-block 121 and for the first sub-ECC data 125 begins during the second cycle 311 and continues into the third cycle 312.

During the third cycle 312, processing of the third sub-block 123 using the third ECC data 127 begins with third syndrome processing 351 for the third sub-block 123. In addition, the first Chien search processing 333 for the first sub-block 121 and for the first sub-ECC 125 data completes, and second key equation generation 342 for the second sub-block 122 is performed. Also illustrated, during the third cycle 312, upon conclusion of the first Chien search processing 333 for the first sub-block 121 and for the first sub-ECC data 125, second Chien search processing 343 for the second sub-block 122 and for the second sub-ECC data 126 begins. An elapsed time is illustrated between completion of the second key equation processing 342 and the beginning of the second Chien search processing 343 during the third cycle 312, resulting from the first Chien search processing 333 occupying the Chien search pipeline stage. The temporary interruption in processing of the second sub-block 122 is depicted for the purpose of illustration of pipeline processing in general and should not be considered a limitation or necessarily representative of processing within the system 300.

Processing of the fourth sub-block 124 using the fourth ECC data 128 begins during the fourth cycle 313 with fourth syndrome processing 361. Also during the fourth cycle 313, third key generation 352 for the third sub-block 123 begins and is followed by initiation of third Chien search processing 353 for the third sub-block 123 and for the third sub-ECC data 127. Also during the fourth cycle 313, the second Chien search processing 343 completes for the second sub-block 122 and for the second sub-ECC data 126.

During the fifth cycle 314, fourth key equation generation 362 for the fourth sub-word 124 is performed. Also, third Chien search processing 353 for the third sub-block 123 and for the third sub-ECC data 127 completes and fourth Chien search processing 363 for the fourth sub-block 124 and for the fourth sub-ECC data 128 begins. In addition, during the fifth cycle 314, syndrome processing 324 of the main ECC operation 304 completes and key equation generation 322 of the main ECC begins. As illustrated, sub-ECC processing of the first and second sub-blocks 121 and 122 has completed and sub-ECC processing of the third and fourth sub-blocks 123 and 124 is underway when the main ECC operation 304 begins the key equation generation 322.

During the sixth cycle 315, sub-ECC processing for the fourth sub-block 124 terminates while the main ECC key equation generation 322 continues. As a result, upon initiation of the main ECC Chien search processing 323, a search starting location and/or one or more regions to be analyzed during the Chien search processing 323 may be known as a result of processing the individual sub-blocks 121-124. For example, when sub-ECC processing of the first sub-block 121 and the second sub-block 122 completes without uncorrectable errors occurring, the Chien search processing 322 need not be applied during the main ECC operation 304 for data bits within the first and second sub-blocks 121 and 122 and within the first and second ECC blocks 125 and 126.

If the sub-ECC operation 302 of the third sub-block 123 indicated uncorrectable errors, while the fourth sub-block 124 is indicated as being correctable by the sub-ECC operation 302, the Chien search processing 323 may be controlled to process only the third sub-block 123 and the third ECC block 127. A total processing time to perform the Chien search processing 323 for the main ECC 304, which in conventional systems may be proportional to a length of ECC page 120 and may constitute a substantial proportion of the decoding process, may be reduced by a factor of four or more. As another example, when the sub-ECC operation 302 indicates that none of the sub-words 121-124 have uncorrectable errors, the Chien search processing 323 of the main ECC operation 304 may be limited to only a search of the ECC data 129 or may be skipped altogether.

Figure 4A:
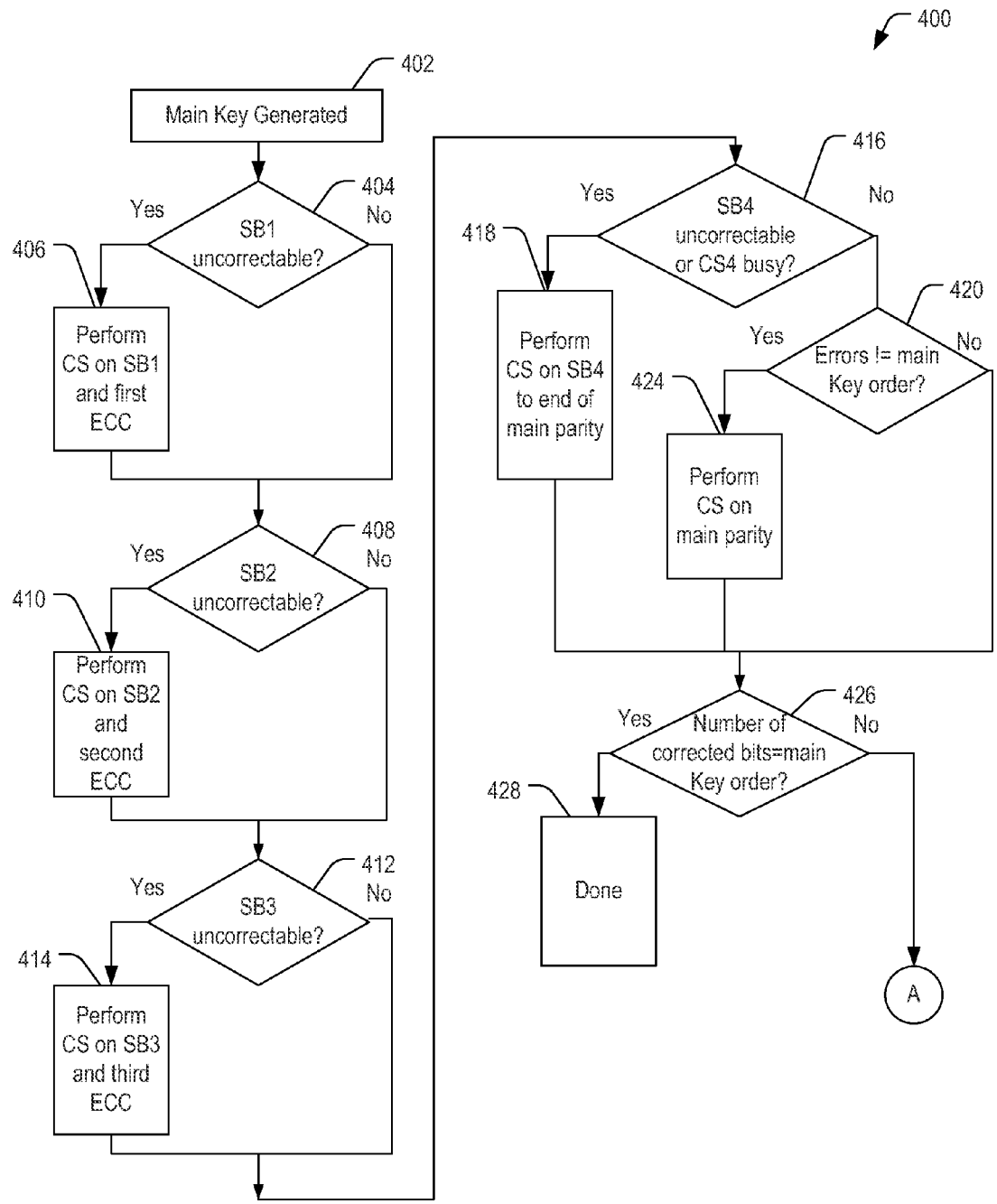
FIGS. 4A-4B are flow diagrams of a particular illustrative embodiment of a method to control a Chien search during data block processing based on results of sub-block processing in a distributive ECC processing system.
Figure 4B:
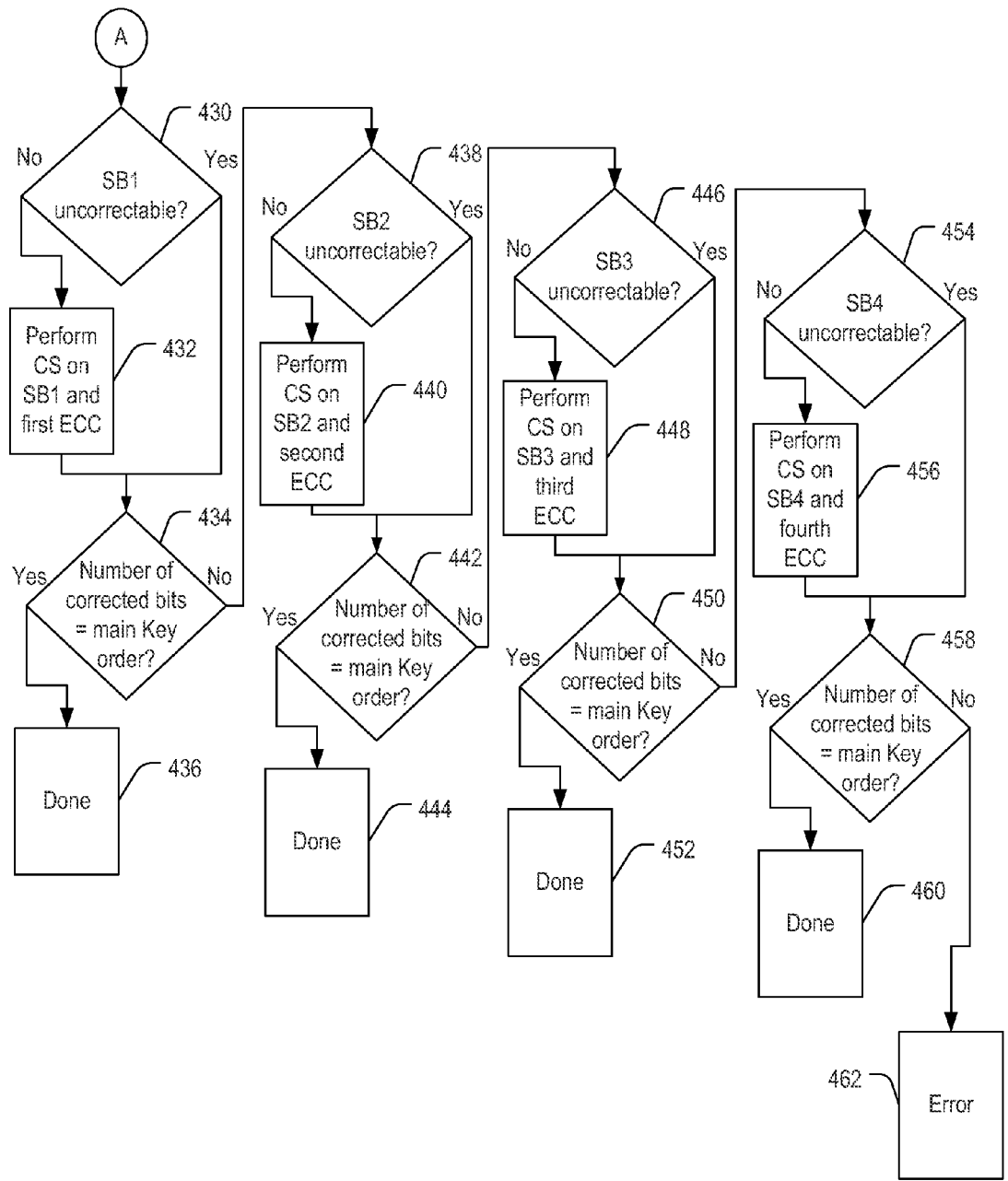

Referring to FIG. 4A-B, a particular embodiment of a method 400 is depicted that begins on FIG. 4A and continues to FIG. 4B. The method 400 illustrates a process that may be performed based on results of sub-ECC processing, such as by the control circuitry 206 of FIG. 2. The method 400 is explained with reference to the data flow diagram of FIG. 3. FIG. 4A depicts performing a Chien search on sub-blocks indicated by the sub-ECC operation as having uncorrectable errors and determining whether all errors in the ECC word have been corrected. FIG. 4B depicts processing when errors remain uncorrected (e.g. one or more of the sub-blocks was mis-corrected during sub-ECC processing) and includes performing a Chien search on sub-blocks indicated as not having uncorrectable errors.

An indication that main key generation processing has completed is received, at 402. For example, the indication may be received following the key generation processing 322 of FIG. 3. A determination is made, at 404, whether the first sub-block 121 resulted in an uncorrectable error. In response to the first sub-block 121 resulting in an uncorrectable error, at 404, a Chien search may be initiated in the main ECC operation 304 starting with a beginning of the first sub-block 121 and continuing to an end of the first sub-ECC data 125.

A determination is made whether the second sub-block 122 resulted in uncorrectable errors, at 408. When the second sub-block 122 is determined to not have resulted in uncorrectable errors, processing continues to 412. Alternatively, when the second sub-block 122 is determined to have resulted in uncorrectable errors, a main ECC Chien search corresponding to the second sub-block 122 and the second sub-ECC data 126 for the second sub-block 122 is performed in the main ECC, at 410, and processing proceeds to 412.

A determination is made whether the third sub-block 123 resulted in uncorrectable errors, at 412. When the third sub-block 123 is determined to not have resulted in uncorrectable errors, processing advances to 416. Alternatively, when the third sub-block 123 is determined to have resulted in uncorrectable errors, the main ECC Chien search processing corresponding to the third sub-block 123 and the third sub-ECC data 127 is performed, at 414, and processing continues to 416.

A determination is made if either the fourth sub-block 124 resulted in uncorrectable errors or processing of the fourth sub-block 124 has not completed, at 416. When either the fourth sub-block 124 resulted in uncorrectable errors or Chien search processing for the fourth sub-block 124 has not completed, at 416, main ECC Chien search processing may be performed beginning with a sequentially first bit of the fourth sub-block 124 and continuing to the end of the ECC page 120 (i.e. including the ECC data 129). Alternatively, when the fourth sub-block 124 is not indicated as having uncorrectable errors and the fourth Chien search processing 363 has completed, processing continues to 420 where a determination is made whether a sum of errors (detected in the sub-ECC operation 302 and in any of the Chien searches of 406, 410, and 414) is equal to an order of the main key equation resulting from the key equation processing 322 of the main ECC operation 304.

In response to determining that the sum of errors found is not equal to the order of the main key equation of the main ECC operation 304, Chien search processing is performed from the beginning of the ECC data 129 of the ECC page 120, at 424. Otherwise, processing continues to 426 where a determination is made whether a number of corrected ECC errors is equal to an order of the key equation generated by the main key processing 322 of the main ECC operation 304. When the number of corrected ECC errors (including sub-ECC and main ECC corrections) equals the order of the key equation resulting from the key equation processing 322, all detected errors based on the main ECC operation 304 have been detected and corrected by the sub-ECC operation 302 and/or by targeted Chien search processing performed at one or more of 406, 410, 414, 418, or a combination thereof. As a result, all detected errors have been corrected, and ECC processing for the ECC page 120 is complete, at 428. When a number of corrected errors is determined to not be equal to an order of the main key equation, at 426, processing continues to 430, illustrated in FIG. 4B.

A determination is made whether the first sub-block 121 was determined by the sub-ECC operation 302 to have uncorrectable errors, at 430. When the first sub-block was determined by the sub-ECC operation 302 to not have uncorrectable errors, Chien search processing of the main ECC operation 304 is performed of the first sub-block 121 and the first sub-ECC data 125, at 432. Continuing to 434, a determination is made whether a number of corrected errors is equal to an order of the main key equation, at 434. When a determination is made that the number of corrected errors is equal to the order of the main key equation, at 434, all detected errors have been corrected and processing is completed, at 436. Otherwise, a determination is made whether the second sub-block 122 was determined by the sub-ECC operation 302 to have resulted in uncorrectable errors, at 438. When the second sub-block 122 was determined by the sub-ECC operation 302 to not have uncorrectable errors, Chien search processing of the main ECC operation 304 is performed on the second sub-block 122 and the second sub-ECC data 126, at 440. After the second Chien search processing is completed, at 440, or when the second sub-block 122 was determined by the sub-ECC operation 302 to have uncorrectable errors, a determination is made whether a number of corrected errors is equal to an order of the main key equation, at 442.

If the number of corrected errors is determined to be equal to an order of the main key equation, at 442, all detected errors have been corrected and processing is complete, at 444. Otherwise, a determination is made whether the third sub-block 123 was determined by the sub-ECC operation 302 to be uncorrectable, at 446. If the third sub-block 123 was determined by the sub-ECC operation 302 to not have uncorrectable errors, Chien search processing of the main ECC operation 304 is performed on the third sub-block 123 and on the third sub-ECC data 127. After completion of the Chien search processing at 448, or after determining that the third sub-block 123 was determined by the sub-ECC operation 302 to have uncorrectable errors, at 446, a determination is made whether the number of corrected errors is equal to the order of the main key equation, at 450.

When the number of corrected errors is determined to be equal to the order of the main equation, at 450, all detected errors have been corrected and processing is complete, at 452. Otherwise, a determination is made whether the fourth sub-block 124 was determined by the sub-ECC operation 302 to have uncorrectable errors, at 454. If the fourth sub-block 124 was determined by the sub-ECC operation 302 to not have uncorrectable errors, at 454, Chien search processing is performed on the fourth sub-block 124 and the fourth sub-ECC data 128, at 456.

A determination is made whether the total corrected errors is equal to the order of the main key equation, at 458. If so, all detected errors have been corrected and processing ends, at 460. If the number of corrected errors is not equal to the order of the main key equation, at 458, the number of errors that have occurred is beyond the capacity of the main ECC operation 304, an error is generated, at 462, and processing terminates.

Figure 5:
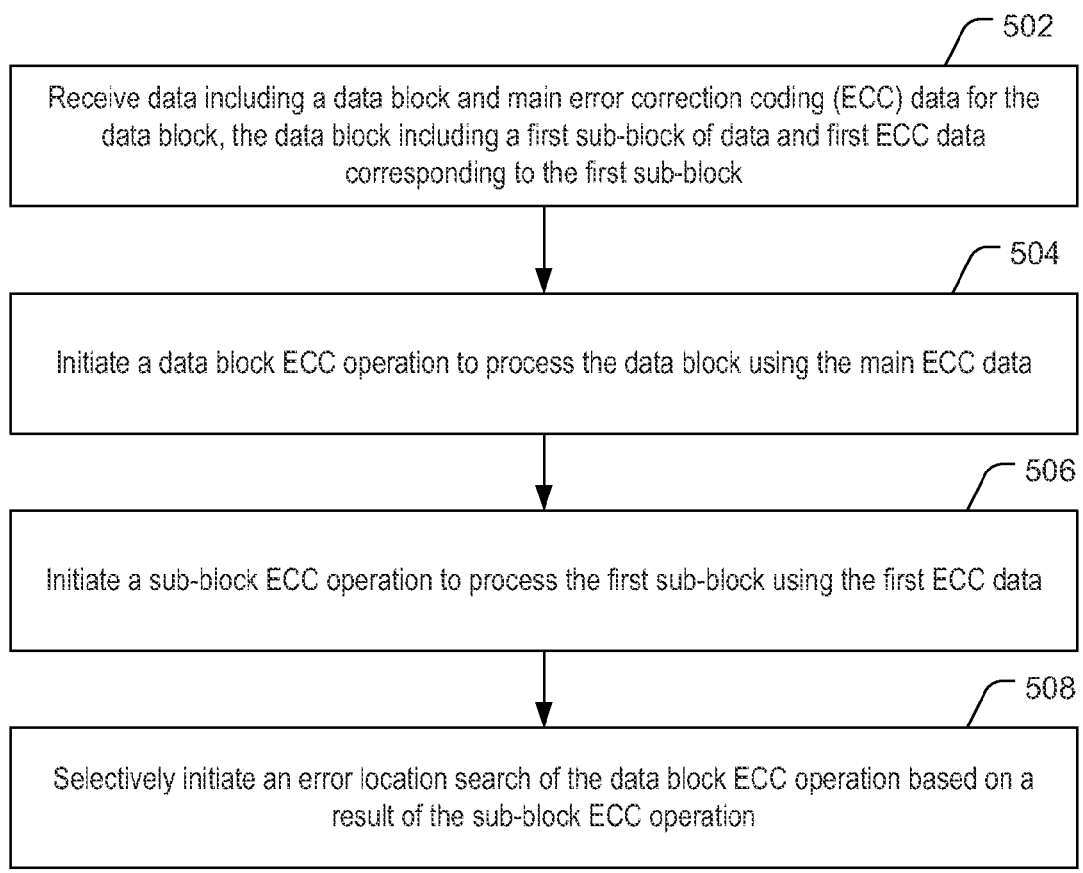
FIG. 5 is a flow diagram of a particular illustrative embodiment of a method of distributive ECC processing.

FIG. 5 is a flow chart of an embodiment of a method of distributive ECC processing. The method may be performed in a controller of a memory device, such as the controller 110 of FIG. 1. The method includes receiving data including a data block and main error correction coding (ECC) data for the data block, at 502. The data block includes a first sub-block of data and first ECC data corresponding to the first sub-block. The memory device may include a non-volatile memory and receiving the data may be performed by reading the data from the non-volatile memory and sending the read data to an ECC engine of the controller. For example, the ECC page 120 may be received as the read data 116 at the ECC engine 114 of FIG. 1.

A data block ECC operation is initiated to process the data block using the main ECC data, at 504. The data block ECC operation may include a main syndrome generation process, a main key equation generation process, and a main error location process. For example, the data block ECC operation may be the main ECC operation 304 of FIG. 3. Initiating the data block ECC operation may be performed by providing the data to an input of a data block ECC decoder, such as the data block ECC decoder 142 of FIG. 1 and instructing the data block ECC decoder to begin processing the data.

A sub-block ECC operation is initiated to process the first sub-block using the first ECC data, at 506. The data block ECC operation and the sub-block ECC operation may be initiated substantially concurrently. The sub-block ECC operation may include a sub-block syndrome generation process, a sub-block key equation generation process, and a sub-block error location process for each sub-block in the data block. The data block may include a second sub-block and second ECC data corresponding to the second sub-block. The sub-block ECC operation may further process the second sub-block using the second ECC data. The sub-block ECC operation may be pipelined and processing of the second sub-block may at least partially overlap processing of the first sub-block. For example, the sub-block ECC operation may be the sub-ECC operation 302 of FIG. 3. Initiating the sub-block ECC operation may be performed by providing the data to an input of a sub-block ECC decoder, such as the sub-block ECC decoder 140 of FIG. 1, and instructing the sub-block ECC decoder to begin processing the data.

An error location search of the data block ECC operation is selectively initiated based on a result of the sub-block ECC operation, at 508. For example, in response to the sub-block ECC operation indicating uncorrectable errors in the first sub-block, the error location search may be initiated to start at a beginning of the first sub-block. The error location search may include a Chien search, such as the Chien search processing 323 of FIG. 3.

To illustrate, selectively initiating the error location search of the data block ECC operation based on the result of the sub-block ECC operation may be performed by receiving starting location data indicating a starting bit location of a sub-block that is uncorrectable by the sub-block ECC operation, such as the Chien search starting location 260 of FIG. 2. Ending location data indicating an ending bit location of ECC data corresponding to the sub-block that is uncorrectable by the sub-block ECC operation may also be received, such as the Chien search ending location 262 of FIG. 2. The error location search may be initiated to sequentially process the data from the starting bit location to the ending bit location.

The data block ECC operation may determine a first number of errors in the data. The first number of errors is determined by the data block ECC operation, such as based on an order of a key equation corresponding to the data block. The first number of errors may be compared to a second number of errors that are corrected by the sub-block ECC operation, such as at the decision 420 of FIG. 4A.

When the data block includes multiple sub-blocks, the error location search may be controlled to process each of the multiple sub-blocks identified during the sub-block ECC operation as having uncorrectable errors. For example, a Chien search may be selectively performed in response to decisions 404, 408, 412, and 416 of FIG. 4A. After completing an error location search of each of the multiple sub-blocks identified as having uncorrectable errors, a number of corrected errors may be compared to the first number of errors in the data. In response to the first number of errors exceeding the number of corrected errors, the error location search may be controlled to process the main ECC data, as illustrated at 420-424 of FIG. 4A.

The number of corrected errors may be updated when one or more errors are corrected in the main ECC data. When the first number of errors exceeds the number of corrected errors, the error location search may be controlled to process at least one of the multiple sub-blocks that is not identified during the sub-block ECC operation as having uncorrectable errors, such as in response to decisions 430, 438, 446, and 454 of FIG. 4.

Although the distributive ECC system of FIG. 1 is implemented in a data storage device, in other embodiments the distributive ECC system can be implemented in other systems such as a communication system. For example, the ECC engine 114 of FIG. 1 may be implemented in a wireless receiver to correct errors occurring during transmission of an encoded signal.

Although the ECC page 120 is illustrated as having four sub-blocks 121-124, in other embodiments the ECC page 120 may have fewer than four sub-blocks or more than four sub-blocks. The sub-blocks may be equally sized or may have different sizes within the ECC page 120. In addition, although the sub-block operation 302 of FIG. 3 and processing of FIG. 4 are illustrated as sequentially processing the sub-blocks 121-124, in other embodiments sub-block processing may be performed in a non-sequential order or may skip one or more sub-blocks. For example, average ECC decode latency can be reduced by processing a single sub-block concurrently with the main block and controlling a Chien search in the main block based on a result of processing the sub-block.

Although various components depicted herein are illustrated as block components and described in general terms, such components may include one or more microprocessors, state machines, or other circuits configured to enable the data storage device 102 of FIG. 1 to perform the particular functions attributed to such components. For example, the sub-block ECC decoder 140 and the data block ECC decoder 142 of FIG. 1 may represent physical components, such as hardware controllers, state machines, logic circuits, or other structures to enable the ECC engine 114 of FIG. 1 to perform distributive ECC processing using a result of the sub-block ECC decoder 140 to adjust processing at the data block ECC decoder 142.

The sub-block ECC decoder 140 and the data block ECC decoder 142 of FIG. 1 may be implemented as dedicated hardware (i.e. circuitry) for reduced latency. Alternatively, one or both the sub-block ECC decoder 140 and the data block ECC decoder 142 of FIG. 1 may be implemented using a microprocessor or microcontroller programmed to perform one or more stages of ECC decoding, such as syndrome generation, key equation generation, or error location searching. In a particular embodiment, one or both the sub-block ECC decoder 140 and the data block ECC decoder 142 includes executable instructions that are executed by a processor and the instructions are stored at the memory 112. Alternatively, or in addition, executable instructions that are executed by a processor that may be included in the controller 110 may be stored at a separate memory location that is not part of the memory 112, such as at a read-only memory (ROM) (not shown).

In a particular embodiment, the data storage device 102 may be a portable device configured to be selectively coupled to one or more external devices. However, in other embodiments, the data storage device 102 may be attached or embedded within one or more host devices, such as within a housing of a portable communication device. For example, the data storage device 102 may be within a packaged apparatus such as a wireless telephone, personal digital assistant (PDA), gaming device or console, portable navigation device, or other device that uses internal non-volatile memory. In a particular embodiment, the data storage device 102 includes a non-volatile memory, such as a flash memory (e.g., NAND, NOR, Multi-Level Cell (MLC), Divided bit-line NOR (DI-NOR), AND, high capacitive coupling ratio (HiCR), asymmetrical contactless transistor (ACT), or other flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Accordingly, the disclosure and the figures are to be regarded as illustrative rather than restrictive.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
    in a controller of a memory device:
        receiving data including a data block and main error correction coding (ECC) data for the data block, the data block including a first sub-block of data and first ECC data corresponding to the first sub-block;
        initiating a data block ECC operation to process the data block using the main ECC data;
        initiating a sub-block ECC operation to process the first sub-block using the first ECC data; and
        selectively initiating an error location search of the data block ECC operation based on a result of the sub-block ECC operation.

2. The method of claim 1, wherein in response to the sub-block ECC operation indicating uncorrectable errors in the first sub-block, the error location search is initiated to start at a beginning of the first sub-block.

3. The method of claim 1, wherein the error location search includes a Chien search.

4. The method of claim 1, wherein the data block includes a second sub-block and second ECC data corresponding to the second sub-block, and wherein the sub-block ECC operation further processes the second sub-block using the second ECC data.

5. The method of claim 4, wherein the sub-block ECC operation is pipelined and wherein processing of the second sub-block at least partially overlaps processing of the first sub-block.

6. The method of claim 1, wherein the data block ECC operation determines a first number of errors in the data, and further comprising:
    comparing the first number of errors to a second number of errors that are corrected by the sub-block ECC operation.

7. The method of claim 1, wherein the data block includes multiple sub-blocks, and further comprising:
    controlling the error location search to process each of the multiple sub-blocks that is identified during the sub-block ECC operation as having uncorrectable errors.

8. The method of claim 7, further comprising, after completing the error location search of each of the multiple sub-blocks identified as having uncorrectable errors:
    comparing a number of corrected errors to a first number of errors in the data, wherein the first number of errors is determined by the data block ECC operation; and
    in response to the first number of errors exceeding the number of corrected errors, controlling the error location search to process the main ECC data.

9. The method of claim 8, wherein the first number of errors is based on an order of a key equation corresponding to the data block.

10. The method of claim 8, further comprising:
    updating the number of corrected errors when one or more errors are corrected in the main ECC data; and
    when the first number of errors exceeds the number of corrected errors, controlling the error location search to process at least one of the multiple sub-blocks that is not identified during the sub-block ECC operation as having uncorrectable errors.

11. The method of claim 1, wherein the memory device further comprises a non-volatile memory, and wherein receiving the data is performed by:
    reading the data from the non-volatile memory; and
    sending the read data to an ECC engine of the controller.

12. The method of claim 1, wherein:
    initiating the data block ECC operation is performed by:
        providing the data to an input of a data block ECC decoder; and
        instructing the data block ECC decoder to begin processing the data; and
    initiating the sub-block ECC operation is performed by:
        providing the data to an input of a sub-block ECC decoder; and
        instructing the sub-block ECC decoder to begin processing the data.

13. The method of claim 12, wherein the data block ECC operation and the sub-block ECC operation are initiated concurrently.

14. The method of claim 1, wherein selectively initiating the error location search of the data block ECC operation based on the result of the sub-block ECC operation is performed by:
    receiving starting location data indicating a starting bit location of a sub-block that is uncorrectable by the sub-block ECC operation;
    receiving ending location data indicating an ending bit location of ECC data corresponding to the sub-block that is uncorrectable by the sub-block ECC operation; and
    initiating the error location search to sequentially process the data from the starting bit location to the ending bit location.

15. The method of claim 1, wherein the data block ECC operation includes a main syndrome generation process, a main key equation generation process, and a main error location process, and wherein the sub-block ECC operation includes a sub-block syndrome generation process, a sub-block key equation generation process, and a sub-block error location process for each sub-block in the data block.

16. A data storage device comprising:
a memory; and
a controller coupled to the memory, wherein the controller comprises an error correction coding (ECC) engine including:
  a data block ECC decoder configured to process data retrieved from the memory, the data including a data block and main ECC data for the data block; and
  a sub-block ECC decoder configured to process sub-blocks of the data block and ECC data corresponding to the sub-blocks,
wherein the ECC engine is configured to initiate processing of the data at the data block ECC decoder and at the sub-block ECC decoder concurrently.

17. The data storage device of claim 16, wherein the ECC engine is configured to selectively initiate an error location search at the data block ECC decoder based on a result of the sub-block ECC decoder.

18. The data storage device of claim 17, wherein the ECC engine further comprises control circuitry responsive to the sub-block ECC decoder and configured to select a starting location of the error location search at the data block ECC decoder to search for errors in sub-blocks that are identified as uncorrectable by the sub-block ECC decoder.

19. The data storage device of claim 16, wherein the processing at the data block ECC decoder at least partially overlaps the processing at the sub-block ECC decoder.

20. A data storage device comprising:
a flash memory; and
a controller coupled to the flash memory, wherein the controller comprises an error correction coding (ECC) engine including:
  a data block ECC decoder configured to process data retrieved from the flash memory, the data including a data block and main EC) data for the data block;
  a sub-block ECC decoder configured to process sub-blocks of the data block and ECC data corresponding to the sub-blocks; and
  control circuitry responsive to the sub-block ECC decoder and configured to select a starting location of an error location search at the data block ECC decoder to search for errors in sub-blocks that are identified as uncorrectable by the sub-block ECC decoder.

21. The data storage device of claim 20, wherein the ECC engine is configured to initiate processing of the data at the data block ECC decoder and at the sub-block ECC decoder concurrently.

22. The data storage device of claim 20, wherein the data storage device is configured to be removably coupled to a host device.

23. The data storage device of claim 20, wherein the data storage device is configured to be coupled to a host device as embedded memory.

* * * * *

UNITED STATES PATENT AND TRADEMARK OFFICE
CERTIFICATE OF CORRECTION

PATENT NO. : 8,392,807 B2  
APPLICATION NO. : 12/882357  
DATED : March 5, 2013  
INVENTOR(S) : Jayaprakash Naradasi et al.

Page 1 of 1

It is certified that error appears in the above-identified patent and that said Letters Patent is hereby corrected as shown below:

In the Claims section, Column 14, Claim 20, Line 8, "data block and main EC) data for the data block;" should read --data block and main ECC for the data block;--.

Signed and Sealed this  
Twenty-fifth Day of June, 2013

Teresa Stanek Rea  
*Acting Director of the United States Patent and Trademark Office*

UNITED STATES PATENT AND TRADEMARK OFFICE
CERTIFICATE OF CORRECTION

PATENT NO. : 8,392,807 B2
APPLICATION NO. : 12/882357
DATED : March 5, 2013
INVENTOR(S) : Jayaprakash Naradasi et al.

It is certified that error appears in the above-identified patent and that said Letters Patent is hereby corrected as shown below:

In the Claims

Column 14, Claim 20, Line 8, "data block and main EC) data for the data block;" should read --data block and main ECC data for the data block;--.

This certificate supersedes the Certificate of Correction issued June 25, 2013.

Signed and Sealed this
Twelfth Day of August, 2014

Michelle K. Lee
*Deputy Director of the United States Patent and Trademark Office*